United States Patent
Ten Berge et al.

(10) Patent No.: US 10,816,907 B2
(45) Date of Patent: Oct. 27, 2020

(54) METHOD FOR DETERMINING AN OPTIMIZED SET OF MEASUREMENT LOCATIONS FOR MEASUREMENT OF A PARAMETER OF A LITHOGRAPHIC PROCESS, METROLOGY SYSTEM AND COMPUTER PROGRAM PRODUCTS FOR IMPLEMENTING SUCH METHODS

(71) Applicant: ASML NETHERLANDS B.V., Veldhoven (NL)

(72) Inventors: Peter Ten Berge, Eindhoven (NL); Christiaan Theodoor De Ruiter, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/344,034

(22) PCT Filed: Sep. 27, 2017

(86) PCT No.: PCT/EP2017/074439
§ 371 (c)(1),
(2) Date: Apr. 23, 2019

(87) PCT Pub. No.: WO2018/086795
PCT Pub. Date: May 17, 2018

(65) Prior Publication Data
US 2019/0258178 A1 Aug. 22, 2019

(30) Foreign Application Priority Data
Nov. 10, 2016 (EP) ..................................... 16198271

(51) Int. Cl.
*G03F 7/20* (2006.01)

(52) U.S. Cl.
CPC ...... *G03F 7/70625* (2013.01); *G03F 7/70616* (2013.01); *G03F 7/70633* (2013.01); *G03F 7/70641* (2013.01)

(58) Field of Classification Search
CPC ............. G03F 7/70641; G03F 7/70633; G03F 7/70625
See application file for complete search history.

(56) References Cited

U.S. PATENT DOCUMENTS

| | | | |
|---|---|---|---|
| 8,887,107 | B2 | 11/2014 | Mos et al. |
| 2006/0033921 | A1 | 2/2006 | Den Boef et al. |

(Continued)

FOREIGN PATENT DOCUMENTS

| | | |
|---|---|---|
| TW | 201203416 | 1/2012 |
| TW | 201633009 | 9/2016 |

(Continued)

OTHER PUBLICATIONS

International Search Report and Written Opinion issued in corresponding PCT Patent Application No. PCT/EP2017/074439, dated Jan. 18, 2018.

(Continued)

*Primary Examiner* — Steven Whitesell Gordon
(74) *Attorney, Agent, or Firm* — Pillsbury Winthrop Shaw Pittman LLP

(57) ABSTRACT

A method, and associated system, for determining an optimized set of measurement locations for measurement of a parameter related to a structure applied to a substrate by a semiconductor manufacturing process. The method includes determining a first set of parameter values from a first set of measurements of first structures across a first plurality of locations, for example from target measurements and determining a second set of parameter values from a second set of measurements of second structures across a second plurality (Continued)

rality of locations, for example using an SEM or e-beam tool on product structures. A correlation is determined between the first set of parameter values and the second set of parameter values and used to determine the optimized set of measurement locations.

22 Claims, 2 Drawing Sheets

(56) References Cited

U.S. PATENT DOCUMENTS

| | | |
|---|---|---|
| 2006/0066855 A1 | 3/2006 | Den Boef et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2011/0170091 A1 | 7/2011 | Chang et al. |
| 2012/0044470 A1 | 2/2012 | Smilde et al. |
| 2012/0084041 A1* | 4/2012 | Izikson .............. G03F 7/70616 702/113 |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2014/0354969 A1 | 12/2014 | Elings et al. |
| 2015/0170904 A1 | 6/2015 | Tsen et al. |
| 2015/0331336 A1* | 11/2015 | Quintanilha ........ G03F 7/70683 355/77 |
| 2016/0223322 A1 | 8/2016 | Liu et al. |

FOREIGN PATENT DOCUMENTS

| | | |
|---|---|---|
| WO | 03071471 | 8/2003 |
| WO | 2009078708 | 6/2009 |
| WO | 2009106279 | 9/2009 |
| WO | 2013092106 | 6/2013 |
| WO | 2013178422 | 12/2013 |

OTHER PUBLICATIONS

Taiwanese Office Action issued in corresponding Taiwanese Patent Application No. 106136039, dated Jul. 17, 2018.
Pelligrini, Joseph C., et al: "Super Sparse Overlay Sampling Plans: An Evaluation of Methods and Algorithms for Optimizing Overlay Quality Control and Metrology Tool Throughput", Proc. of SPIE, vol. 3677, Mar. 1999.

* cited by examiner

METHOD FOR DETERMINING AN OPTIMIZED SET OF MEASUREMENT LOCATIONS FOR MEASUREMENT OF A PARAMETER OF A LITHOGRAPHIC PROCESS, METROLOGY SYSTEM AND COMPUTER PROGRAM PRODUCTS FOR IMPLEMENTING SUCH METHODS

CROSS-REFERENCE TO RELATED APPLICATIONS

This application claims priority of EP/US application 16198271.5 which was filed on Nov. 10, 2016 and which is incorporated herein in its entirety by reference.

BACKGROUND

Field of the Invention

The present invention relates to methods and apparatus for measuring a structure on a substrate and models for error correction. The invention may be applied for example in metrology of microscopic structures, for example to assess critical dimensions (CD) or overlay performance of a lithographic apparatus.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An irradiated target portion of the substrate is often referred to as an "exposure field", or simply "field". The layout of the fields on the substrate is typically a network of adjacent rectangles. One field may be further divided into "dies", a "die" typically being defined as an area on a reticle or substrate associated with a fully functional integrated circuit layer. Often a reticle comprises circuits of patterns for multiple integrated circuits, a field does then include multiple dies.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

While measuring a performance parameter, such as overlay, on targets using scatterometry or imaging may be relatively quick and non-destructive, it may not be truly representative of the parameter for the actual product. One reason for this is because the actual product structures are much (orders of magnitude) smaller than the size of the target structures which are required for scatterometry or imaging measurements, and this difference in size can result in different parameter behavior (e.g., pattern placement and resulting overlay for metrology targets may differ from pattern placement and resulting overlay of actual structures). This difference in behavior is referred to herein as Metrology-to-Device offset, or MTD offset. To correct for the MTD offset, MTD metrology is performed to measure directly the product parameter (e.g., but not limited to, using a scanning electron microscope (SEM) or electron beam metrology device). The MTD offset can then be determined from the difference of these direct product parameter measurements and corresponding metrology target measurements which can be used as a correction for subsequent target metrology measurements in a feedback control loop. However, the direct product parameter measurements are slow and often destructive. It would therefore be desirable to optimize this MTD metrology, such that a non-destructive overlay metrology measurement on targets can serve to determine the overlay of actual structures.

SUMMARY OF THE INVENTION

In a first aspect of the invention, there is provided a method to determine an optimized set of measurement locations for measurement of a parameter related to a structure applied to a substrate by a semiconductor manufacturing process, the method comprising: determining a first set of parameter values for the parameter from a first set of measurements on first structures across a first plurality of locations; determining a second set of parameter values from a second set of measurements on second structures across a second plurality of locations; determining a correlation between said first set of parameter values and said second set of parameter values; and using the determined correlation to determine the optimized set of measurement locations.

In a second aspect of the invention, there is provided a system comprising a processor operable to: obtain a first set of parameter values of a parameter related to first structures applied to a substrate by a lithographic process at a first plurality of locations; obtain a second set of parameter values related to second structures applied to a substrate by a lithographic process at a second plurality of locations; determine a correlation between said first set of parameter values and said second set of parameter values; and use the determined correlation to determine an optimized set of measurement locations for subsequent measurement of the parameter using said second measurement device.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
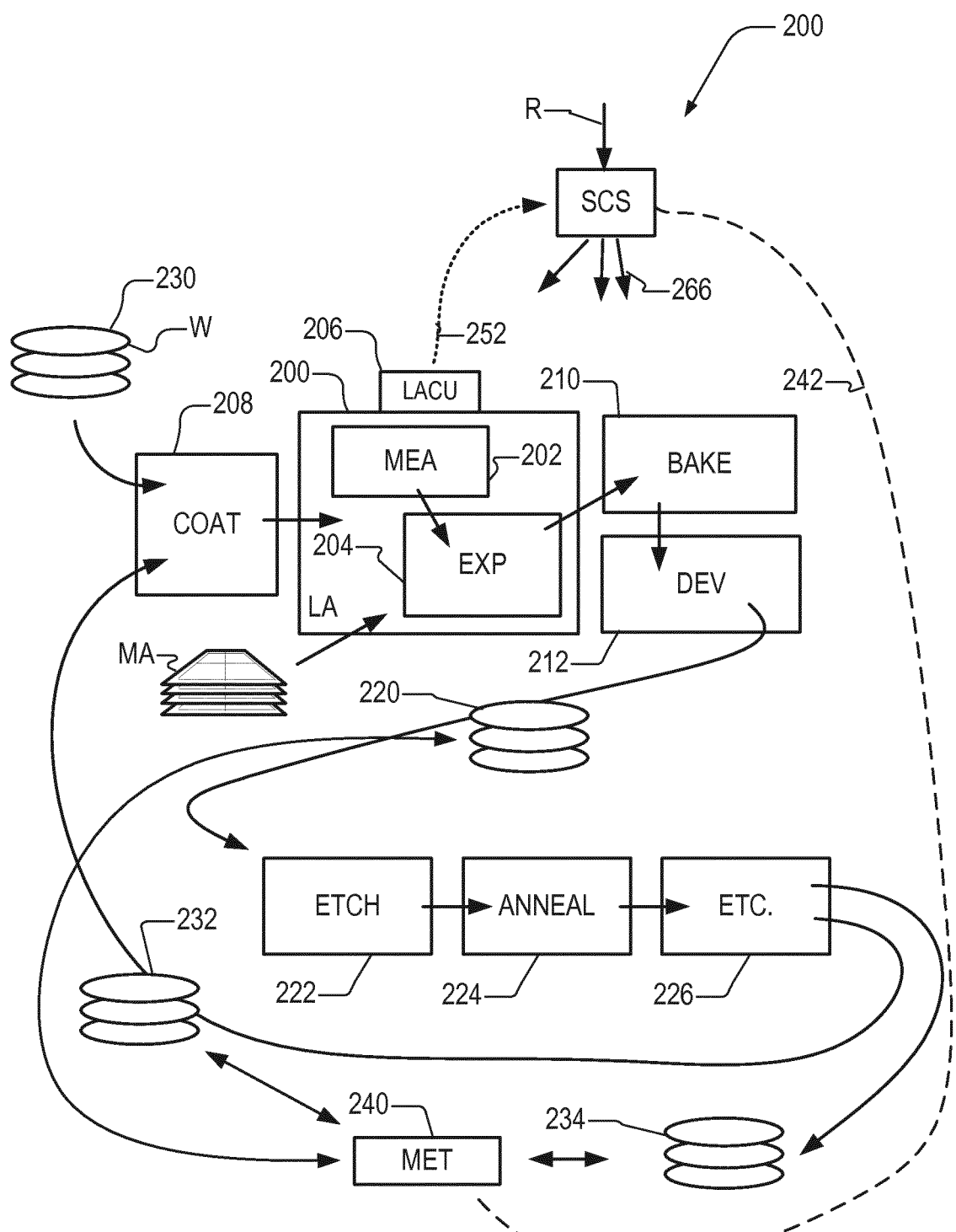
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. The LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out.

The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

A metrology apparatus suitable for use in embodiments of the invention is shown in FIG. 2(a). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Figure 2:
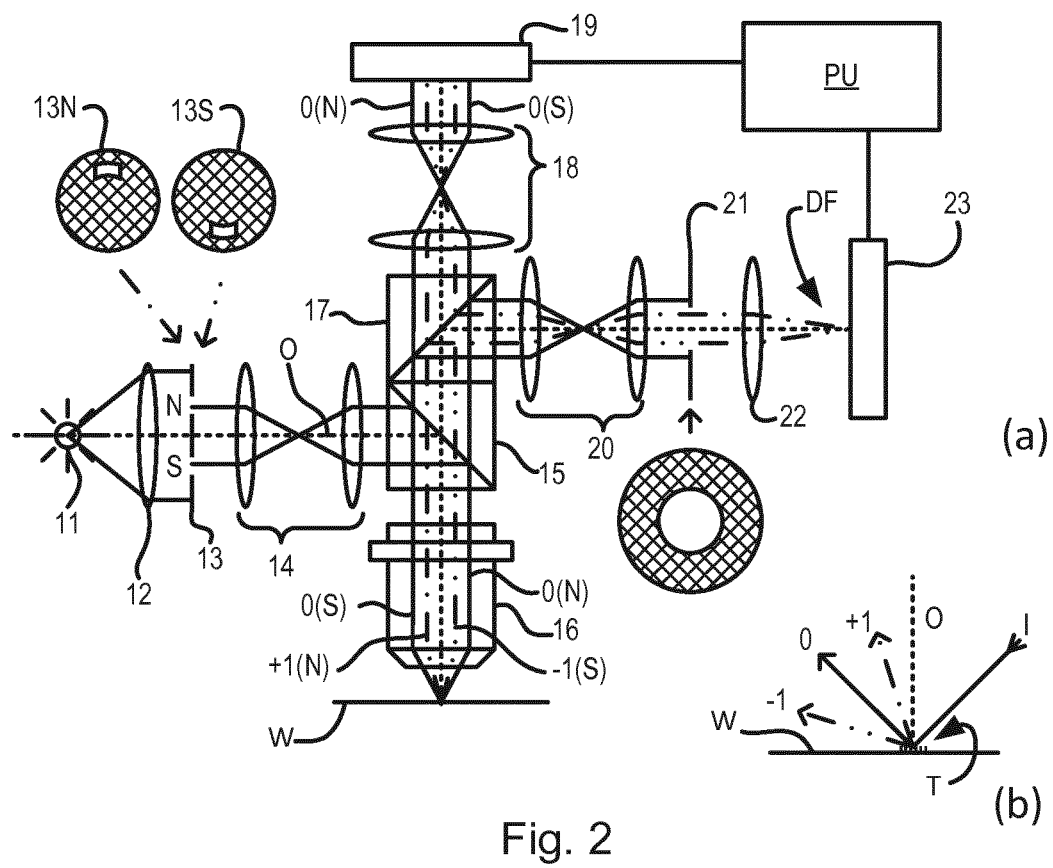
FIG. 2 comprises a schematic diagram of a scatterometer for use in measuring targets according to embodiments of the invention.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$ $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process.

Process control has been applied to the semiconductor industry for many years. Substrates are measured with metrology tools and a correction model is applied to measured data in order to calculate model parameters. Those parameters are then used to control the process. Therefore, the performance of process control depends on metrology measurement scheme and correction model. It is known that there is a trade-off between metrology measurement effort and modeling accuracy.

Metrology performed on dedicated targets using a scatterometry-based or image-based metrology apparatus has the advantage of being relatively fast compared to other techniques such as electron beam (e-beam) metrology or scanning electron microscope (SEM) metrology. However, the targets used for such scatterometry-based or image-based metrology need to be sufficiently large to be measurable using such techniques. This means that the target structures are required to be significantly larger (e.g., 1 to 2 orders of magnitude larger) than the actual product structures to which the measurements are meant to relate. As a consequence, lithographic and other processes may locally and globally interact differently with the smaller product structures and larger dedicated metrology targets. The result is an offset between measurements of a parameter on an actual product structure, for example using an SEM or e-beam device, and measurements of the same parameter on a metrology target (on the same substrate) using for example scatterometry. The remaining discussion will refer to scatterometry based metrology for the faster measurements, although it will be appreciated that in each case image-based metrology, or any other metrology technique which is relatively fast (compared for example to SEM or e-beam metrology) but requires target structures larger than product structures, will be equally applicable and within the scope of the disclosure. This offset is referred to throughout this disclosure as metrology-to-device offset or MTD offset. This MTD offset has both intrafield contributions (variation of the MTD offset across a field which is common to all individual fields on the substrate) and interfield contributions (behavior of the MTD offset across the substrate which is not related to an intrafield contribution).

To mitigate for the MTD offset, MTD offset metrology may be performed to measure the MTD offset, thereby enabling correction of target measurements performed using a scatterometer. MTD offset metrology may comprise measuring a parameter (e.g., overlay) on an actual product structure (product-resolution measurements) using a suitable technique (e.g., SEM or e-beam metrology), measuring the same parameter on a scatterometer target on the same substrate and determining the difference between the two measurements. This may be repeated at various locations per substrate, and/or per field to capture interfield and intrafield variation of this MTD offset. MTD offset metrology may be be performed on a per batch/layer/product basis.

MTD offset metrology may be executed using SEM or e-beam metrology, which is quite slow (typically taking longer than 10 s per measurement point). However, to be effective, measurements should be repeated/updated frequently. This takes significant time and resources, particularly when performed per layer and per product. Therefore it is proposed to optimize this process, and in particular optimize the amount of information obtained regarding the MTD offset per product-resolution measurement performed.

The proposed methods comprise optimizing the sampling scheme for MTD offset metrology from an input comprising a fingerprint of the difference (delta-fingerprint) between product-resolution measurements and nearby target measurements of a parameter. The output will be an optimized sampling plan which best captures this delta-fingerprint. Several optimality statistical criteria may be used to optimize a metrology sampling scheme based on a given correction model. A popular optimality criterion, which may be used here for example, is normalized model uncertainty (also called as G-optimality). The physical meaning of model uncertainty is standard deviation of correctable errors for given position. As such, normalized model uncertainty can be calculated per measurable (or specified) position. Following that, statistical measures (e.g. maximum, mean plus $3\sigma$ etc.) can be used to evaluate a reduced sampling scheme.

Since the input fingerprints contain both interfield variations (for example: as a result of various wafer processes such as etch and CMP) and intrafield variations (for example: within wafer intra-die stress distribution as in 3DNAND), the MTD offset may be described with intrafield and interfield models.

Figure 3:
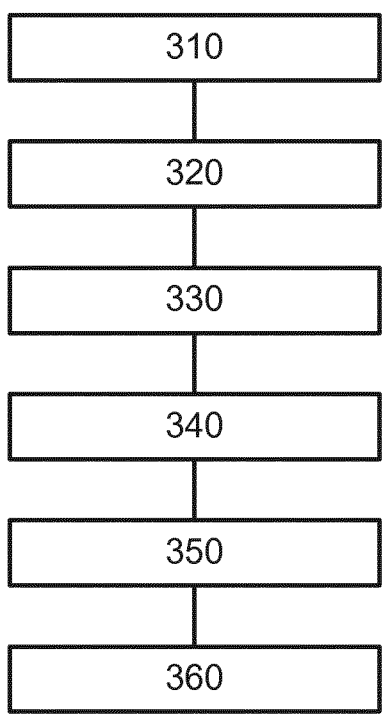
FIG. 3 is a flowchart describing a method according to an embodiment of the invention.

FIG. 3 is a flowchart describing a method for optimizing a sampling scheme. At step 310, using a scatterometer such as that illustrated in FIG. 2(*a*), measurements of metrology targets or other suitably sized structures (large enough to be measured using scatterometry techniques) are made. The substrate may be measured densely (i.e., at a large number of target locations, both within a field and over the whole substrate) during this step to maximize capture of interfield and intrafield effects. The measurements at this step may be performed using angle-resolved scatterometry or dark-field imaging, for example, depending on the device being used and parameter being measured. As already stated, other (e.g., image-based) metrology techniques may be utilized as well.

At step 320, for each target measurement made at step 310, a nearby device structure is measured using, for example, an SEM, e-beam or at-resolution overlay (ARO) metrology device or other device capable of performing measurements directly on product structures (product-resolution measurements). The MTD offset is then determined by calculating the difference between a measurement value related to the metrology target and a measurement value related to the nearby device structure. The MTD offset may have some dependence on the distance between the metrology target and it's associated (nearby) device structure. The (average and/or variation of the) distance between the metrology target and the device structure across the substrate may be taken into account to reduce the impact of distance variations on the determined MTD offset values. In an embodiment, the average distance between each target measurement at step 310 and its corresponding product-resolution measurement at step 320 is minimized. In another embodiment, the distance variation across the substrate between each target measurement at step 310 and its corresponding product-resolution measurement at step 320 is minimized.

In the measurement steps 310, 320, any suitable (metrology target based) parameter may be measured, for example: overlay, focus, CD, edge placement error, side wall angle. These steps may be performed per layer and/or per product.

The examples provided for measurement steps 310, 320 refer to measurement of device structures (or product-resolution measurements) and to measurement of target structures. It should be appreciated that the concepts herein are not limited to these examples. More generally the first measurement step comprises performing a measurement on first structures and the second measurement step comprises performing a measurement on second structures. The first structures may comprise target structures and the first measurement step may comprise measuring the target structures using diffraction based metrology or image based metrology, for example. Of relevance is that the first structures are representative structures and there may be an offset between measurements of these representative first structures and of the actual structures to which the measurements relate.

The second structures are described below as being actual product structures. However, this is not necessarily so. In other embodiments, the second structures may also be representative structures (e.g., target structures). The difference between the measurements of the first structure and second structures in such an example may be sufficiently representative of the MTD offset (if not the actual MTD offset). An example could be where the first structure is a first target with a first characteristic (for example a pitch, CD, geometry) and the second structure is a second target with a second characteristic. The measured difference may then be used as the MTD offset, or alternatively used to derive (e.g., model) the MTD offset (possibly using knowledge of the device structures). The first and second targets may be comprised in different layers of the stack.

The second measurement step is disclosed as comprising SEM, e-beam metrology or at-resolution overlay (ARO) methods. However other quality indication representative of yield may be used. For example the second measurement step to obtain a second set of measurement values may comprise performing an electrical measurement test on the second structures to determine their quality, given an indication of an expected yield.

At step 330, the difference between the measurements from step 310 and corresponding measurements at step 320 is calculated over the substrate, to find the delta-fingerprint for the MTD offset. At step 340, a model or combination of models is determined which describes the delta-fingerprint for the MTD offset. The modeling may comprise any known modeling techniques, such as those used for capturing interfield and intrafield error fingerprints (e.g., overlay/CD/focus fingerprints) in known techniques for modeling errors. For example Zernike function models or radial basis functions may be used (e.g., in particular to capture interfield effects). Other models may comprise those based on Fourier series or polynomial series. Where a combination of models are determined, the models may comprise an interfield model and an intrafield model. In addition, models may be determined per layer and/or per product. The modeling may be a simple fit to the measurements without taking into account any a priori knowledge e.g., of known patterns or effects. Alternatively, such known patterns can be used as an input or constraint to the modeling process. A priori knowledge may comprise for example, aberration driven pattern placement. For example, where it is known that a certain process causes greater MTD offset variation near the edge of the substrate, a constraint may be applied when fitting the model to the measurements which favors sampling points toward the substrate edge. Similarly, another known pattern may be a known slit fingerprint (a variation of the MTD offset with along a particular axis of a field on the substrate). A constraint may be applied when fitting the model to the measurements which favors sampling points along an axis which show least variation.

At step 350, an optimal sampling scheme is determined. This may comprise downsampling the measurements performed at steps 310 and 320 using one or more quality/performance indications, e.g., key performance indicators (KPIs) and KPI specs. The KPIs and KPI specs may be defined, for example, in terms of one or more of: model uncertainty, uniformity and noise suppression. In particular, the sampling scheme may minimize the number of measurements required to achieve one or more of said KPIs, so as to (for example) meet a model uncertainty, uniformity and/or noise suppression criteria.

In an embodiment, model uncertainty may be defined as:

$$\sigma_{noise}\sqrt{c_p^T(C^TC)^{-1}c_p}$$

where C represents the design matrix of a reduced sampling scheme, $C_p$ represents a design matrix of any measurable position and $\sigma_{noise}$ is a noise factor (variance).

At step 360, an export report is generated with the determined sampling scheme (comprising a number of measurement locations). This sampling scheme will be used for MTD offset metrology during production (e.g., by an SEM or e-beam apparatus).

The disclosed methods may also comprise using the determined sampling scheme when performing MTD offset metrology in process control during a lithographic production process. The MTD offset metrology data obtained from measurements at the locations defined by the sampling scheme can then be used to determine a correction for more regularly performed target-based (e.g., scatterometer) production measurements in a process control loop (for example an overlay, focus, CD or SWA control loop).

In an embodiment, the model(s) determined (e.g., at step 340) can be used to estimate parameter values for the product structures (production second parameter values) from the target measurements (production first parameter values), e.g., in a shadow process control loop. In this way, a good approximation of an actual device parameter value at a particular location can be obtained from at least one nearby scatterometer target measurement and the appropriate model(s).

The proposed methods therefore result in an improved device patterning performance (in terms of e.g., overlay, focus or other parameter) as a result of a better MTD offset determination and/or reduced cost by reduced resource requirement for the MTD offset determination.

Further embodiments of the invention are disclosed in the list of numbered embodiments below:

1. A method to determine an optimized set of measurement locations for measurement of a parameter related to a structure applied to a substrate by a semiconductor manufacturing process, the method comprising:
   determining a first set of parameter values for the parameter from a first set of measurements on first structures across a first plurality of locations;
   determining a second set of parameter values from a second set of measurements on second structures across a second plurality of locations;
   determining a correlation between said first set of parameter values and said second set of parameter values; and
   using the correlation to determine the optimized set of measurement locations.

2. A method according to embodiment 1, wherein the second set of parameter values comprise values for said parameter.

3. A method according to embodiment 2, wherein the step of determining a correlation comprises: determining a difference between the first set of parameter values and said second set of parameter values; and
   determining one or more models to describe said difference over said substrate.

4. A method according to embodiment 3, wherein said step of determining a difference comprises determining a set of differences from corresponding pairs of values from said first set of parameter values and said second set of parameter values, wherein each corresponding pair of values comprises values from a pair of corresponding measurement locations from said first plurality of measurement locations and second plurality of measurement locations respectively.

5. A method according to embodiment 4, wherein displacement between the measurement locations of each pair of corresponding measurement locations is minimized 6. A method according to embodiment 4 or 5, wherein variation of displacement between the measurement locations of each pair of corresponding measurement locations is minimized 7. A method according to any of embodiments 3 to 6, wherein said step of determining one or more models comprises fitting said one or more models to said difference over said substrate.

8. A method according to any of embodiments 3 to 7, wherein said step of determining one or more models comprises determining at least an interfield model and an intrafield model.

9. A method according to any of embodiments 3 to 8, wherein said step of determining one or more models comprises applying a constraint when determining the models based on a priori knowledge of effects relating to said difference.

10. A method according to any of embodiments 3 to 9, wherein said step of determining the optimized set of measurement locations comprises minimizing the number of measurement locations while meeting requirements for said one or more models in terms of at least one performance indication.

11. A method according to embodiment 10, wherein said at least one performance indication comprises one or more of: model uncertainty, noise suppression and uniformity.

12. A method according to any of embodiments 3 to 11, comprising using said one or more models and a measurement of at least one first structure to estimate a parameter value for said parameter applicable to one of said second structures.

13. A method according to embodiment 1, wherein the second set of parameter values comprise values for another parameter which correlates with said parameter.

14. A method according to any of embodiments 1 to 13, comprising a step of performing measurements to obtain said second set of measurement values using a scanning electron microscope or electron beam metrology device.

15. A method according to any preceding embodiment, wherein said second structures comprise product structures.

16. A method according to embodiment 13, wherein the second set of parameter values are obtained from electrical measurements of said second structures.

17. A method according to any of embodiments 1 to 15, wherein said second structures comprise target structures representative of product structures.

18. A method according to any preceding embodiment, wherein said first structures each comprise periodic target structures.

19. A method according to any preceding embodiment, comprising a step of performing measurements to obtain said first set of measurement values using a scatterometry technique.

20. A method according to any of embodiments 1 to 18, comprising a step of performing measurements to obtain said first set of measurement values using an image-based metrology technique.

21. A method according to any preceding embodiment, wherein said parameter is overlay.

22. A method according to any of embodiments 1 to 20, wherein said parameter is focus or dose.

23. A method according to any of embodiments 1 to 20, wherein said parameter is one of critical dimension, side wall angle or edge placement error.

24. A method according to any preceding embodiment, wherein said optimized set of measurement locations comprises fewer locations than said second plurality of locations.

25. A method of controlling a lithographic process comprising: obtaining an optimized set of measurement locations, determined using the method of any preceding embodiment;
measuring first structures on a processed substrate to obtain production first parameter values relating to the parameter;
determining any deviation of said production first parameter from nominal;
controlling a process parameter of the lithographic process to minimize said deviation on subsequent substrates;
measuring second structures on a processed substrate at locations determined by said optimized set of measurement locations to obtain production second parameter values relating to said parameter; and using said production second parameter values to correct for any differences between said production first parameter values and said production second parameter values.

26. A method according to embodiment 25, wherein said step of measuring first structures is performed more frequently than said step of measuring second structures.

27. A method according to embodiment 25 or 26, wherein said step of using said production second parameter values to correct for any differences between said production first parameter values and said production second parameter values comprises determining a correction to be applied to measurements of said first structures to compensate for said differences between said production first parameter values and said production second parameter values.

28. A method according to any of embodiments 25 to 27, wherein said step of measuring first structures is performed using a scatterometry technique.

29. A method according to any of embodiments 25 to 27, wherein said step of measuring first structures is performed using an image-based metrology technique.

30. A method according to any of embodiments 25 to 29, wherein said step of measuring second structures is performed using a scanning electron microscope or electron beam metrology device.

31. A computer program product comprising machine readable instructions which, when run on a suitable processor, cause the processor to perform the method of any of embodiments 1 to 30.

32. A system comprising a processor operable to:
obtain a first set of parameter values for a parameter related to first structures applied to a substrate by a lithographic process at a first plurality of locations;
obtain a second set of parameter values related to second structures applied to a substrate by a lithographic process at a second plurality of locations;
determine a correlation between said first set of parameter values and said second set of parameter values; and
use the determined correlation to determine an optimized set of measurement locations for subsequent measurement of the parameter using said second measurement device.

33. A system according to embodiment 32, wherein said second set of parameter values comprise values for said parameter.
34. A system according to embodiment 33, wherein, in determining a correlation, the processor is operable to:
determine a difference between the first set of parameter values and said second set of parameter values; and
determine one or more models to describe said difference over said substrate.
35. A system according to embodiment 34, wherein, in determining a difference, said processor is operable to determining a set of differences from corresponding pairs of values from said first set of parameter values and said second set of parameter values, wherein each corresponding pair of values comprises values from a pair of corresponding measurement locations from said first plurality of measurement locations and second plurality of measurement locations respectively.
36. A system according to embodiment 35, operable such that displacement between the measurement locations of each pair of corresponding measurement locations is minimized.
37. A system according to embodiment 35 or 36, operable such that variation of displacement between the measurement locations of each pair of corresponding measurement locations is minimized
38. A system according to any of embodiments 39 to 37, wherein, in determining one or more models, the processor is operable to fit said one or more models to said difference over said substrate.
39. A system according to any of embodiments 39 to 38, wherein, in determining one or more models, the processor is operable to determine at least an interfield model and an intrafield model.
40. A system according to any of embodiments 39 to 39, wherein the processor is operable to apply a constraint when determining the models based on a priori knowledge of effects relating to said difference.
41. A system according to any of embodiments 39 to 40, wherein, in determining the optimized set of measurement locations, said processor is operable to minimize the number of measurement locations while meeting requirements for said one or more models in terms of at least one performance indication.
42. A system according to embodiment 41, wherein said at least one performance indication comprises one or more of: model uncertainty, noise suppression and uniformity.
43. A system according to any of embodiments 39 to 42, wherein the processor is operable to use said one or more models and a measurement of at least one first structure to estimate a parameter value for said parameter applicable to one of said second structures.
44. A system according to any of embodiments 32 to 43, wherein said first structures each comprise periodic target structures.
45. A system according to embodiments 32 to 44, wherein said parameter is overlay.
46. A system according to any of embodiments 32 to 44, wherein said parameter is focus or dose.
47. A system according to any of embodiments 32 to 44, wherein said parameter is one of critical dimension, side wall angle or edge placement error.
48. A system according to embodiments 32 to 47, wherein said optimized set of measurement locations comprises fewer locations than said second plurality of locations.
49. A system according to any of embodiments 32 to 48, wherein said second structures comprise product structures.
50. A system according to any of embodiments 32 to 49 further comprising:
a first metrology device operable to perform a first set of measurements of said first structures to determine said first set of parameter values; and
a second metrology device operable to perform a second set of measurements of said second structures to determine said second set of parameter values.
51. A system according to embodiment 50, wherein said first metrology device is a scatterometer-based metrology device.
52. A system according to embodiment 50, wherein said first metrology device is an image-based metrology device.
53. A system according to any of embodiments 50 to 52, wherein said second metrology device is a scanning electron microscope.
54. A system according to any of embodiments 50 to 52, wherein said second metrology device is an electron beam metrology device.
55. A system according to any of embodiments 50 to 54, wherein:
said first metrology device is further operable to perform subsequent measurements of first structures on a processed substrate to obtain production first parameter values relating to said parameter;
said second metrology device is further operable to perform subsequent measurements of second structures on a processed substrate at locations determined by said optimized set of measurement locations to obtain production second parameter values relating to said parameter; and said processor is further operable to:
determine any deviation of said parameter from nominal;
control a process parameter of the lithographic process to minimize said deviation on subsequent production substrates; and
use said production second parameter values to correct for any differences between said production first parameter values and said production second parameter values.
56. A method according to embodiment 55, operable such that said first structures are measured more frequently than said second structures
57. A method according to embodiment 55 or 56, wherein said using said production second parameter values to correct for any differences between said production first parameter values and said production second parameter values comprises determining a correction to be applied to measurements of said first structures to compensate for said differences between said production first parameter values and said production second parameter values.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method to determine an optimized set of measurement locations for measurement of a parameter related to a structure applied to a substrate by a semiconductor manufacturing process, the method comprising:
    determining a first set of parameter values for the parameter from a first set of measurements on first structures across a first plurality of locations;
    determining a second set of parameter values from a second set of measurements on second structures across a second plurality of locations, wherein the second structures are of a different type than the first structures, the second plurality of locations are not included in the first plurality of locations, and/or the second set of measurements is obtained using a different measurement method or apparatus than the first set of measurements;
    determining a correlation between the first set of parameter values and the second set of parameter values; and
    using the correlation to determine the optimized set of measurement locations.

2. The method as claimed in claim 1, wherein the second set of parameter values comprise values for the parameter.

3. The method as claimed in claim 2, wherein determining a correlation comprises:
    determining a difference between the first set of parameter values and the second set of parameter values; and
    determining one or more models to describe the difference over the substrate.

4. The method as claimed in claim 3, wherein determining a difference comprises determining a set of differences from corresponding pairs of values from the first set of parameter values and the second set of parameter values, wherein each corresponding pair of values comprises values from a pair of corresponding measurement locations from the first plurality of measurement locations and second plurality of measurement locations respectively.

5. The method as claimed in claim 4, wherein displacement or variation of displacement between the measurement locations of each pair of corresponding measurement locations is minimized.

6. The method as claimed in claim 3, wherein determining one or more models comprises determining at least an interfield model and an intrafield model.

7. The method as claimed in claim 3, wherein determining the optimized set of measurement locations comprises minimizing the number of measurement locations while meeting requirements for the one or more models in terms of one or more selected from: model uncertainty, noise suppression and/or uniformity.

8. The method as claimed in claim 3, comprising using the one or more models and a measurement of at least one first structure to estimate a parameter value for the parameter applicable to one of the second structures.

9. The method according to claim 3, wherein determining one or more models comprises applying a constraint when determining the models based on a priori knowledge of effects relating to the difference.

10. The method as claimed in claim 1, wherein the second structures comprise product structures.

11. A method of controlling a lithographic process, the method comprising:
    obtaining an optimized set of measurement locations, determined using the method of claim 1;
    obtaining measurements performed on first structures on a processed substrate, which correspond to production first parameter values relating to the parameter;
    determining any deviation of the production first parameter values from nominal;
    controlling a process parameter of the lithographic process to reduce or minimize the deviation on one or more subsequent substrates;
    obtaining measurements performed on second structures on a processed substrate at locations determined by the optimized set of measurement locations, which corresponds to production second parameter values relating to the parameter; and
    using the production second parameter values to correct for any differences between the production first parameter values and the production second parameter values.

12. The method as claimed in claim 11, wherein measurement of first structures is performed more frequently than measurement of second structures.

13. The method as claimed in claim 11, wherein using the production second parameter values to correct for any differences between the production first parameter values and the production second parameter values comprises determining a correction to be applied to measurements of the first structures to compensate for the differences between the production first parameter values and the production second parameter values.

14. The method according to claim 1, wherein the second set of parameter values comprise values for another parameter which correlates with the parameter.

15. The method according to claim 14, wherein the second set of parameter values are obtained from electrical measurements of the second structures.

16. The method according to claim 1, further comprising performing measurements to obtain the second set of measurement values using a scanning electron microscope or electron beam metrology device.

17. The method according to claim 1, wherein the parameter is one selected from: overlay, focus, dose, critical dimension, side wall angle or edge placement error.

18. The method according to claim 1, wherein the second structures are of a different type than the first structures.

19. A non-transitory computer-readable medium comprising instructions stored therein, the instruction, upon execution by a processor system, configured to cause the processor system to at least:
- obtain a first set of parameter values for a parameter related to first structures applied to a substrate by a lithographic process at a first plurality of locations;
- obtain a second set of parameter values related to second structures applied to a substrate by a lithographic process at a second plurality of locations, wherein the second structures are of a different type than the first structures, the second plurality of locations are not included in the first plurality of locations, and/or the second set of measurements is obtained using a different measurement method or apparatus than the first set of measurements;
- determine a correlation between the first set of parameter values and the second set of parameter values; and
- use the determined correlation to determine an optimized set of measurement locations for subsequent measurement of the parameter.

20. The computer-readable medium as claimed in claim 19, further comprising:
- a first metrology device operable to perform the first set of measurements of the first structures to determine the first set of parameter values; and
- a second metrology device operable to perform the second set of measurements of the second structures to determine the second set of parameter values.

21. The computer-readable medium as claimed in claim 20, wherein the first metrology device is a scatterometer-based metrology device and the second metrology device is an electron beam metrology device.

22. A method of controlling a lithographic process, the method comprising:
- determining a first set of parameter values for a parameter from a first set of measurements on first structures across a first plurality of locations, the first structures applied by a semiconductor manufacturing process;
- determining a second set of parameter values from a second set of measurements on second structures across a second plurality of locations, the second structures applied by the semiconductor manufacturing process;
- determining a correlation between the first set of parameter values and the second set of parameter values;
- using the correlation to determine a set of measurement locations; obtaining measurements performed on first structures on a processed substrate, which correspond to production first parameter values relating to the parameter;
- determining any deviation of the production first parameter values from nominal;
- controlling a process parameter of the lithographic process to reduce or minimize the deviation on subsequent substrates;
- obtaining measurements performed on second structures on a processed substrate at locations determined by the set of measurement locations, which corresponds to production second parameter values relating to the parameter; and
- using the production second parameter values to correct for any differences between the production first parameter values and the production second parameter values.

* * * * *